United States Patent [19]

Dubujet

[11] Patent Number: 4,922,122
[45] Date of Patent: May 1, 1990

[54] CIRCUIT FOR THE DETECTION OF ADDRESS TRANSITIONS

[75] Inventor: Bruno Dubujet, Le Tholonet, France

[73] Assignee: SGS-Thomson Microelectronics, SA, Gentilly, France

[21] Appl. No.: 235,324

[22] Filed: Aug. 23, 1988

[30] Foreign Application Priority Data

Sep. 1, 1987 [FR] France ............... 87 12155

[51] Int. Cl.⁵ .......................... H03K 19/017
[52] U.S. Cl. ................. 307/480; 307/452; 307/481; 307/272.1
[58] Field of Search ........... 307/443, 471, 451–452, 307/480–481, 269, 272.1; 365/230, 233

[56] References Cited

U.S. PATENT DOCUMENTS

| | | | |
|---|---|---|---|
| 4,337,525 | 9/1982 | Akatsuka | 365/233 |
| 4,446,389 | 5/1984 | Williams et al. | 307/471 X |
| 4,496,861 | 1/1985 | Bazes | 307/471 X |
| 4,518,872 | 5/1985 | Backes | 307/448 |
| 4,598,216 | 7/1986 | Lauffer et al. | 307/443 |

FOREIGN PATENT DOCUMENTS 0098164 11/1984 European Pat. Off. .
5792484 11/1980 Japan .

Primary Examiner—David Hudspeth
Attorney, Agent, or Firm—Roland Plottel

[57] ABSTRACT

A circuit for the detection of address transistions in an integrated circuit comprises a logic signal input terminal, a D flip-flop for memorizing the state of the input signal, and a comparator having a first input terminal connected to the logic signal input terminal and a second input terminal connected to the output terminal of the memorizing means. The comparator gives a first logic level when its input terminals receive a same logic signal level and a second logic signal level when its input terminals receive different logic signal levels. This circuit enables the generation of an output pulse as soon as there is an input address transition, in such a way that the time delay of the output with respect to the address transition is kept to a minimum and the duration of the pulse is suitable for use in the integrated circuit which is sought to be activated.

9 Claims, 4 Drawing Sheets

CIRCUIT FOR THE DETECTION OF ADDRESS TRANSITIONS

BACKGROUND OF THE INVENTION

1. Field of the Invention

The present invention concerns a circuit for the detection of address transitions in an integrated circuit. To reduce consumption by integrated circuits, it is becoming increasingly common to activate them only when there is a change, at the input terminal, in the level of the address signals or validation signals of the circuit. When nothing happens, the consumption of the circuit is low but all the same, it is not zero. Circuits to detect transitions of addresses are already known and enable the detection of a change in level or of the leading edge at the input terminal.

2. Description of the Prior Art

Commonly used circuits are generally made up of chains of inverters. The detection method consists in measuring the level of the signals at different points of this chain and in combining them in logic gates with the input signal so as to obtain an output pulse as soon as there is a change in level at the input terminal.

Unfortunately, the pulse generated at the output terminal as soon as there has been a change in level at the input terminal is necessarily delayed by the propagation time in the inverters, for the circuit is series-connected. Furthermore, the duration of the pulse and its time delay with respect to the transition are related and are a function of the transfer time in the inverters. If a wide pulse is sought so that it can be used properly, its time delay will be all the greater.

To overcome these drawbacks, the invention proposes a circuit for the detection of address transitions which minimizes the time delay in the pulse generated at the output terminal as soon as there is a change in level at the input terminal.

SUMMARY OF THE INVENTION

The invention therefore relates to a circuit for the detection of address transitions in an integrated circuit wherein an output pulse is generated as soon as there is a change in address at the input terminal, said detection circuit comprising:

a logic signal input terminal, means for memorizing the state of the input signal, comparison means having a first input terminal connected to the logic signal input terminal and a second input terminal connected to the output terminal of the memorizing means, said comparison means giving a first logic signal level when its input terminals receive the same logic signal level and giving a second logic signal level when its input terminals receive different logic signal levels.

BRIEF DESCRIPTION OF THE DRAWINGS

Other features and advantages of the invention will appear from the following description made with reference to the appended drawings, of which.

DESCRIPTION OF PREFERRED EMBODIMENTS

Figure 1:
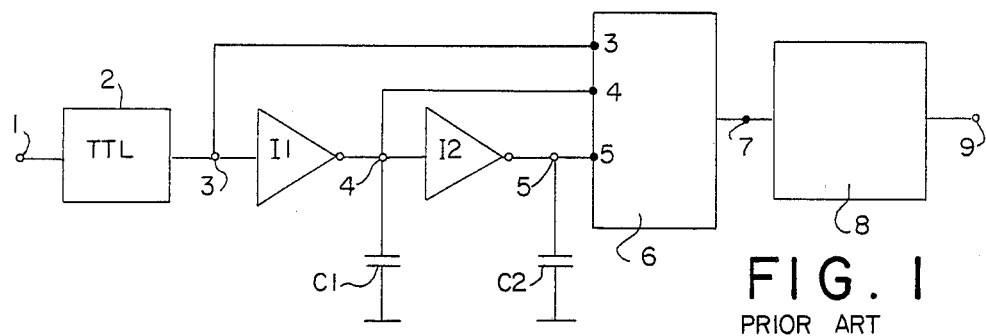
FIG. 1 shows a circuit for the detection of address transitions made with CMOS technology, according to the prior art.

FIG. 1 shows a CMOS technology circuit for the detection of address transitions according to the prior art.

The input terminal 1 of this prior art circuit is connected to a prior art type adaptor unit 2 for adapting TTL (transistor transistor logic) to CMOS technology. For, the signals processed in a CMOS technology integrated circuit can come from external circuits made with a different technology, for example, TTL bipolar technology. This adaptor 2 enables operation on voltages with a level of 0 volt or 5 volts.

The output terminal 3 of the adaptor unit 2 is connected to the input terminal of an inverter $I_1$, followed by a capacitor $C_1$ in parallel. The output terminal 4 of the inverter $I_1$ is connected to the input terminal of an inverter $I_2$, followed by a capacitor $C_2$ in parallel. The output terminal 5 of the inverter $I_2$, the output terminal 4 of the inverter $I_1$ and the output terminal 3 of the adaptor unit 2 are connected to the input terminals of a logic comparison unit 6. The capacitors $C_1$ and $C_2$, respectively added in parallel after each inverter $I_1$ and $I_2$, enable the increasing of the transfer time in each inverter.

The transfer time in an inverter is about one nanosecond. The fact of adding a capacitor enables an increase in this time of about two to three nanoseconds per inverter. A longer transfer time is sought deliberately. For, at the instant when the signals are compared at the input terminals 3, 4 or 5 in the logic comparison unit 6 without capacitor, it may be difficult, within an interval of only one nanosecond, to see that the signals at input terminals 4 and 5, for example, have the same value.

It is at the output terminal 7 of the logic comparison unit 6 that the pulse is obtained.

It must be noted that the pulse generated at the output terminal 7 is generally of poor quality and, in its state as such, cannot really be used with reliability. This is because the logic comparison unit 6 and the inverters $I_1$, $I_2$ contain a large number of transistors. The pulse generated at the output terminal 7 must be re-shaped in a known type circuit 8, series-connected in the assembly. This circuit considerably delays the generated pulse. The output terminal 9 of this circuit 8 will activate the circuit that follows (not shown herein) as soon as a pulse has been generated.

The logic comparison unit 6 consists of logic gates. It receives the input signals $S_3$ at the terminal 3, $S_4$ at the terminal 4 and $S_5$ at the terminal 5, and must generate a pulse at the output terminal 7 as soon as there is a change in level at the input terminal 1.

To simplify the following description, we shall consider the input terminal of the circuit at point 3, at the output terminal of the TTL adaptor unit 2, and the output terminal at point 7 before it is re-shaped in circuit 8.

Figure 2:
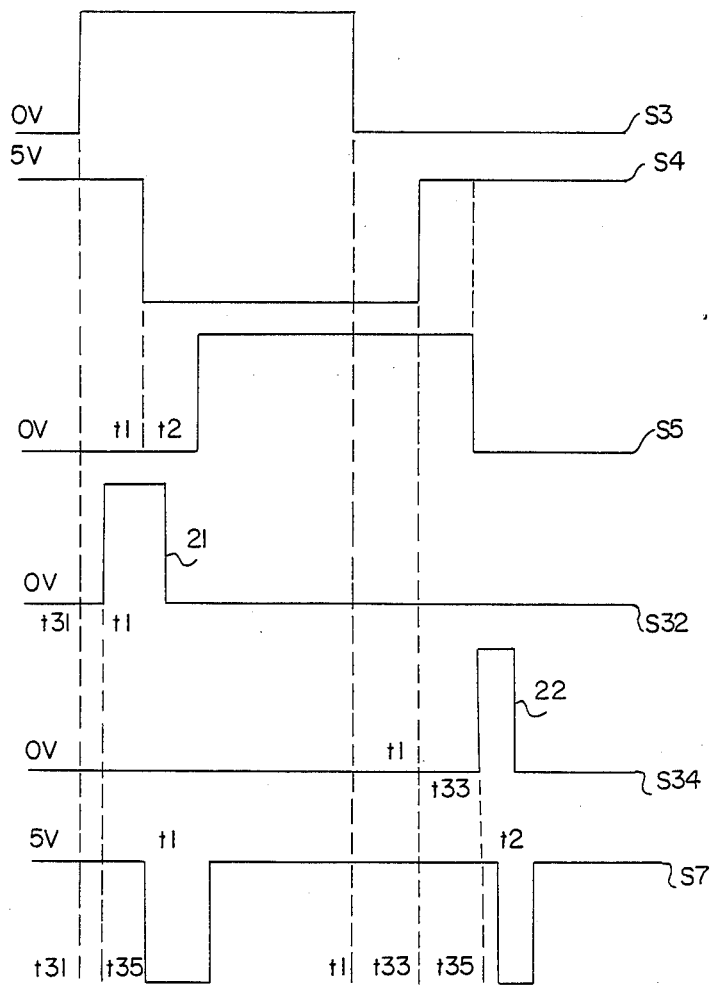
FIG. 2 is a timing diagram of signals at different points of the circuit according to the prior art.

FIG. 2 shows the timing diagrams of the signals $S_3$, $S_4$ and $S_5$ among others.

The transfer time in the inverter $I_1$ followed by the capacitor $C_1$ is $t_1$.

The transfer time in the inverter $I_2$ followed by the capacitor $C_2$ is $t_2$.

The signal $S_3$ represents an address transition from 0 V to 5 V and then from 5 V to 0 V.

The signal $S_4$ is inverted and the address transitions are delayed by the transfer time $t_1$.

The signal $S_5$ is inverted with respect to the signal $S_4$. The transition is delayed by the transfer time $t_2$. It is also delayed by $(t_1+t_2)$ with respect to the transition of the signal $S_3$.

Figure 3:
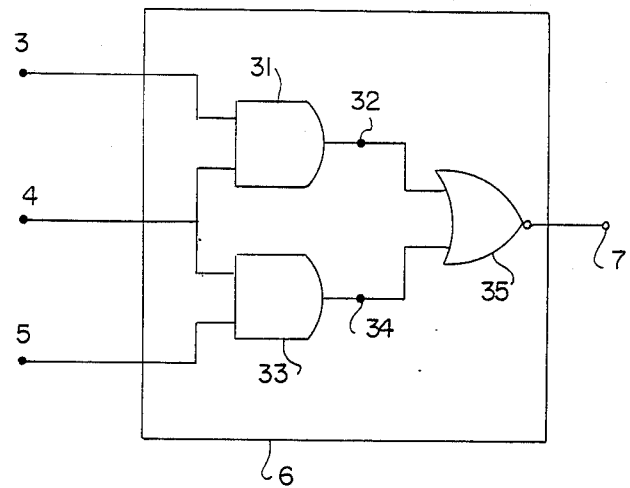
FIG. 3 shows an implementation of the logic comparison unit referred to under reference 6 in FIG. 1.

To obtain the pulse at the terminal 7 as soon as there has been the address transition, the logic gates unit 6 may consist of the combination of logic gates shown in FIG. 3. This example is not the only one. There are other possible combinations.

In FIG. 3, the output terminal 3 of the adaptor unit and the output terminal 4 of the inverter $I_1$ are connected to the input terminals of an AND logic gate 31.

The output terminal 4 of the inverter $I_1$ and the output terminal 5 of the inverter $I_2$ are connected to the input terminals of another AND gate 33. The output terminal 32 of the AND gate 31 and the output terminal 34 of the AND gate 33 are connected to the input terminals of a NOR logic gate 35. The output terminal of this NOR gate is connected to the terminal 7.

FIG. 2 also shows the timing diagrams of the signals $S_{32}$ at the terminal 32, $S_{34}$ at the terminal 34 and $S_7$ at the terminal 7.

The time delay related to the AND gate 31 is $t_{31}$. The time delay related to the AND gate 33 is $t_{33}$. The time delay related to the NOR gate 35 is $t_{35}$.

A pulse 21 with a duration $t_1$ is obtained at terminal 32. This pulse 21 has a time delay $t_{31}$ with respect to the rising edge of the transition of the signal $S_3$.

At terminal 34, a pulse 22 is obtained with a duration $t_2$ and time delay $(t_1+t_{33})$ with respect to the trailing edge of the transition of the signal $S_3$.

At terminal 7, the two pulses 21 and 22 described above are obtained: the first pulse 21 corresponds to the rising edge of the transition of the signal $S_3$. Its time delay is $(t_{31}+t_{35})$, and its duration is $t_1$. The second pulse 22 corresponds to the trailing edge of the transition of the signal $S_3$. Its time delay is $(t_1+t_{33}+t_{35})$, and its duration is $t_2$.

At least one of these pulses will have a time delay related to the transfer time of one of the inverters. In the example described above, this pulse is the second pulse 22 and the corresponding time delay is $t_1$. A different arrangement of the logic gates of the unit 6 could give a time delay related to the first pulse.

At the output terminal 9, it is observed that, at worst, the pulses have a time delay related to the transfer times in the inverters, the logic gates and the re-shaping circuit.

The duration of these pulses is a function of the transfer times in the inverters.

The goal that is sought, therefore is that, at the output terminal 9, the pulse which will be used to activate the circuit should be wide enough to be detected but that it should not be excessively delayed with respect to the address transition at the input terminal.

The circuit according to the invention minimizes this delay because the elements of this circuit are no longer series-connected but parallel-connected.

Figure 4:
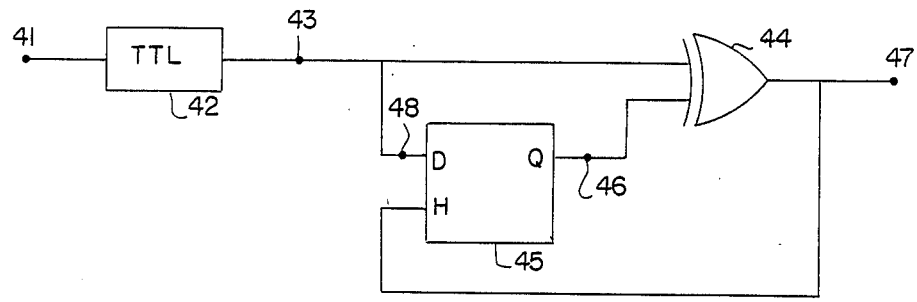
FIG. 4 shows a circuit for the detection of address transitions made with CMOS technology, according to the invention.

FIG. 4 shows a circuit for the detection of address transitions, according to the invention.

The input terminal 41 is connected, as above, to a TTL technology/CMOS technology adaptor unit 42.

The output terminal 43 of the adaptor unit 42 is connected, on the one hand, to one of the input terminals of a comparator 44 and, on the other hand, to the input terminal 48 of a controlled memory 45. The example shows an exclusive-OR gate as a comparator and a D flip-flop circuit as a controlled memory.

The output terminal 46 of the D flip-flop circuit is connected to the other input terminal of the exclusive-OR gate. The output terminal of the exclusive-OR gate is made at a terminal 47. The signal $S_{47}$ at the output terminal 47 also acts as a clock signal at the input terminal H of the D flip-flop circuit.

The circuit that is sought to be activated as soon as an address transition has been detected will be series-connected with the comparator on the terminal 47 but it is not shown in this figure. It is possible to use other comparators or other types of memories.

In particular, the needs of the circuit that is sought to be activated may lead to the use of a NOR-exclusive gate as a comparator. The NOR-exclusive gate has a truth table which is the reverse to that of the exclusive-OR gate.

It shall also be assumed that the input terminal of the circuit is made at the terminal 43 at the output terminal of the TTL adaptor unit to simplify the description.

The operating principle of this circuit is as follows:

A permanent comparison is made, in the exclusive-OR gate 44, of the signal $S_{43}$ at the terminal 43 and the signal $S_{46}$ at the terminal 46. The signal $S_{46}$ is the memorized signal. It has the state of the signal $S_{43}$ before transition.

At the output terminal 47, the signal $S_{47}$ is at a first logic level for as long as the signal $S_{43}$ and $S_{46}$ have the same logic level. As soon as the signals $S_{43}$ and $S_{46}$ have different logic levels, the signal $S_{47}$ goes to a second logic level. In the example that we are describing, the first level is the low level when the signals $S_{43}$ and $S_{46}$ have the same value. The second level is the high level when the signals $S_{43}$ and $S_{46}$ have different values. The signal $S_{46}$ is memorized on the rising edge of the clock signal $S_{47}$. In CMOS technology, the high level is at 5 volts and the low level is at 0 volt.

Figure 5:
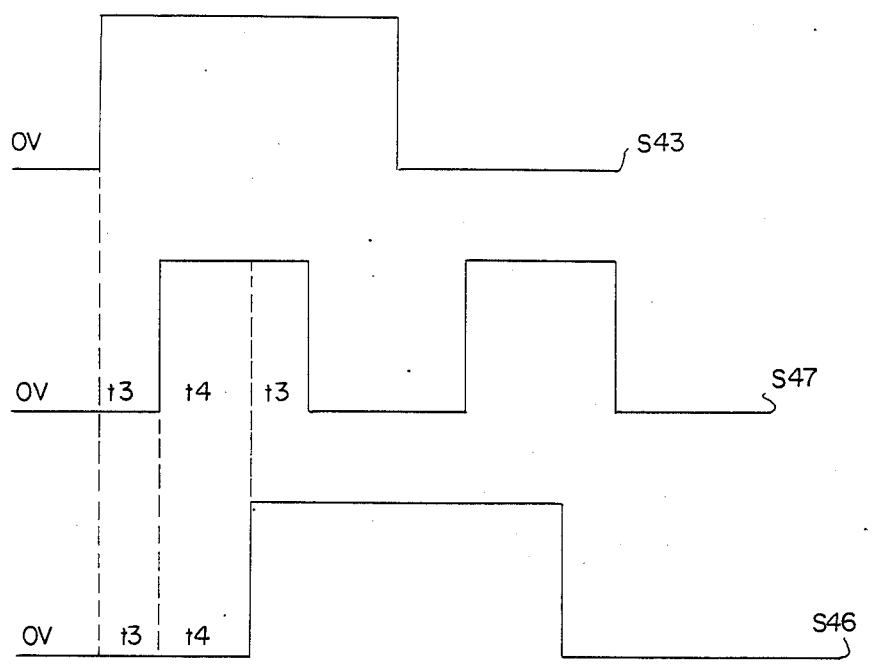
FIG. 5 is a timing diagram of signals at different points of the circuit according to the invention.

The timing diagrams of the signals $S_{43}$, $S_{46}$ and $S_{47}$ are shown in FIG. 5.

As soon as the signals $S_{43}$ and $S_{46}$ have different values, the signal $S_{47}$ goes to the high level. The rising edge of a pulse is generated at terminal 47, said pulse corresponding to the detection of a change in level of the signal $S_{43}$.

At this instant, the clock signal $S_{47}$ at the input terminal H of the D flip-flop circuit activates the memorizing command. The signal $S_{46}$ assumes the new value of the signal $S_{43}$ after the transition. Since the signals $S_{43}$ and $S_{46}$ again have the same value, the signal $S_{47}$ goes to the low level. The trailing edge of the pulse has been generated. The time delay of the pulse at the output terminal 47 with respect to the transition at terminal 43 corresponds to the transfer time $t_3$ in the exclusive-OR gate 44. The duration of the generated pulse is equal to the sum of the transfer time $t_4$ in the D flip-flop circuit 45 and the transfer time $t_3$ in the exclusive-OR gate 44.

Figure 6:
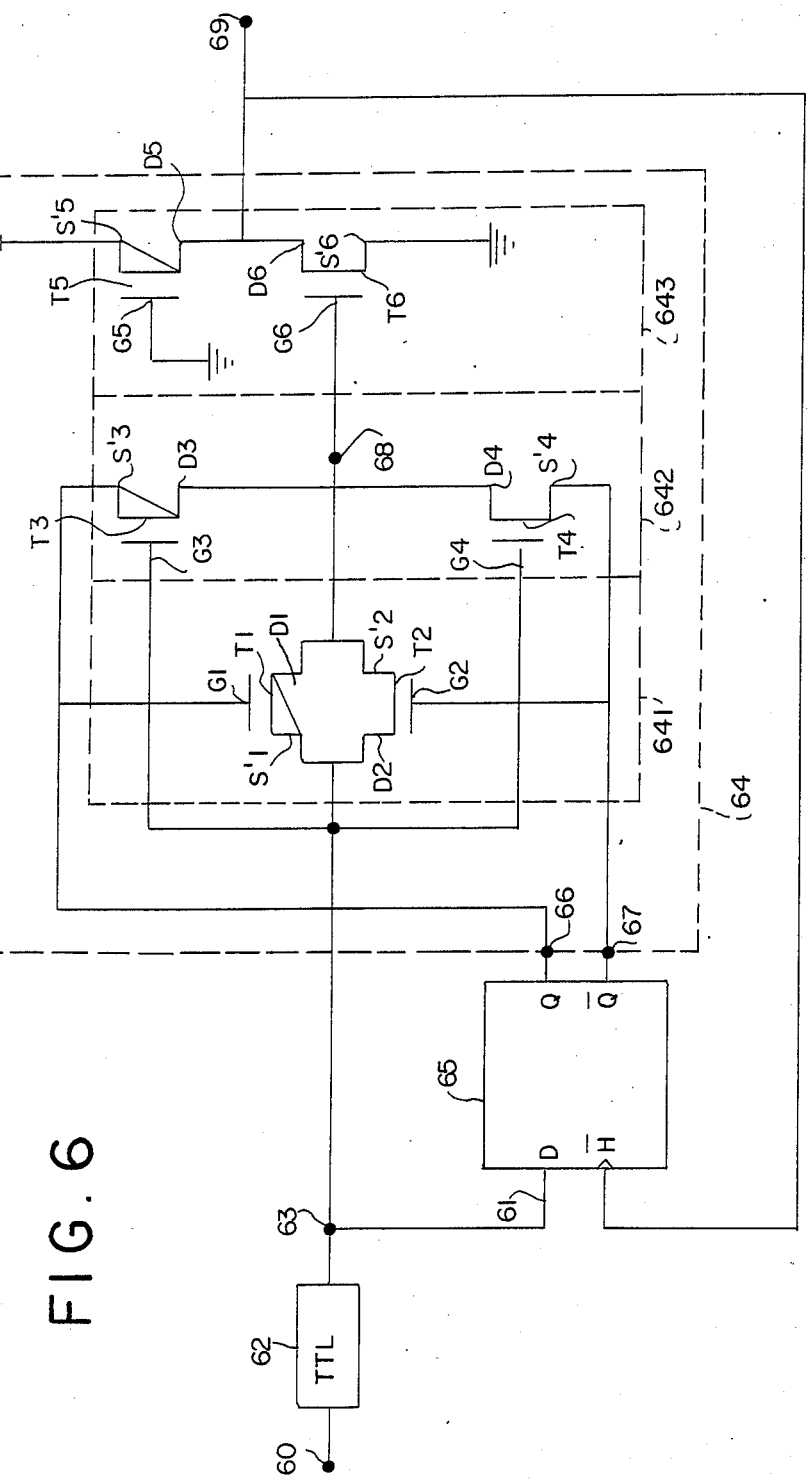
FIG. 6 shows a particular embodiment of a circuit according to the invention.

FIG. 6 shows a particular embodiment of an address transitions circuit made with CMOS technology according to the invention. The input terminal of the circuit is made at a terminal 60. It is followed by an adaptor unit 62 for adapting TTL technology to CMOS technology. The output terminal 63 of this unit 62 is connected, on the one hand, to one of the input terminals of the comparator 64 and, on the other hand, to an input terminal 61 of a controlled memory 65.

The comparator 64 consists of a NOR-exclusive gate. The controlled memory 65 is a D flip-flop circuit. A NOR-exclusive gate cannot be made in a simple way with CMOS technology.

In our example, it consists of an exclusive-OR gate comprising a transfer gate 641 and a pseudo-inverter 642, followed by an inverter 643 in series.

The circuitry 642 is called a "pseudo-inverter" because it is either an inverter or a non-inverting amplifier depending on the value of the signals which are at the output terminals 66 (Q) and 67 ($\overline{Q}$) of the D flip-flop circuit 65.

The PMOS type transistor $T_1$ and the NMOS type transistor $T_2$ form the transfer gate 641. The source $S'_1$ of the transistor $T_1$ is connected to the drain $D_2$ of the transistor $T_2$. The signal $S_{63}$ at the terminal 63 is applied to the common point of $S'_1$ and $D_2$.

The drain $D_1$ of the transistor $T_1$ is connected to the source $S'_2$ of the transistor $T_2$ at the output terminal 68 of the exclusive-OR gate (641, 642).

The gate $G_1$ of the transistor $T_1$ receives the signal $S_{66}$ provided on the output terminal 66 (Q) of the D flip-flop circuit 65.

The gate $G_2$ of the transistor $T_2$ receives the signal $S_{67}$ provided on the output terminal 67 ($\overline{Q}$) of the D flip-flop circuit 65.

The PMOS type transistor $T_3$ and the NMOS type transistor $T_4$ form the pseudo-inverter 642.

The drain $D_3$ of the transistor $T_3$ is connected to the drain $D_4$ of the transistor $T_4$ at the output terminal 68 of the exclusive-OR gate (641, 642).

The source $S'_3$ of the transistor $T_3$ receives the signal $S_{66}$ provided on the output terminal 66 of the D flip-flop circuit 65.

The source $S'_4$ of the transistor $T_4$ receives the signal $S_{67}$ provided on the output terminal 67 of the D flip-flop circuit 65.

The gate $G_3$ of the transistor $T_3$ and the gate $G_4$ of the transistor $T_{46}$ are connected to each other and to the terminal 63.

The operation of the exclusive-OR gate (641, 642) is as follows:

When the signal $S_{66}$ at the output terminal 66 is at the high level, the transfer gate 641 is closed and the pseudo-inverter 642 is on.

The signal $S_{68}$ at the output terminal 68 of the exclusive-OR gate (641, 642) is inverted with respect to the input signal $S_{63}$ at the output terminal 63.

When the signal $S_{66}$ at the output terminal 66 is at the low level, the transfer gate 641 is open and the pseudo-inverter 642 is off.

The signal $S_{68}$ at the output terminal 68 of the exclusive-OR gate (641, 642) is at the same level as the input signal $S_{63}$ at the terminal 63.

The signal $S_{68}$ is then inverted in an inverter 643 formed by the PMOS type transistor $T_5$ and the NMOS type transistor $T_6$.

The signal $S_{68}$ is applied to the gate $G_6$ of the transistor $T_6$, and the gate $G_5$ of the transistor $T_5$ is grounded. The source $S'_5$ of the transistor $T_5$ is raised to the potential $+V$ which is the supply voltage of the circuit. The source $S'_6$ of the transistor $T_6$ is grounded.

The drain $D_5$ of the transistor $T_5$ and the drain $D_6$ of the transistor $T_6$ are connected to each other and to the terminal 69. The signal $S_{69}$ at the terminal 69 is applied to the circuit which is sought to be activated, but it is not shown herein.

This signal $S_{69}$ also performs as a clock signal at the input terminal $\overline{H}$ of the D flip-flop circuit 65. The D flip-flop circuit 65 then reacts at the trailing edge of the signal $S_{69}$.

The time delay and duration of the pulse generated in a circuit according to the invention, shown in FIG. 4, can be computed as follows:

The transfer time $t_3$ in an exclusive-OR gate is small: it is about one nanosecond.

The transfer time $t_4$ in a D flip-flop circuit is about two to three nanoseconds.

Referring to FIG. 4 it is seen that the time delay of the pulse generated at the output terminal 47 with respect to the transition at the terminal 43 will be:

$t = t_3$ $t =$ one nanosecond.

The duration of the pulse generated at the output terminal 47 will be:

$T = t_3 + t_4.$

In the worst case, the value T will be about four nanoseconds.

In the example described as prior art and shown in FIG. 1, the transfer time t8 in the re-shaping circuit 8, which is about two nanoseconds, should not be overlooked. The transfer time in an inverter followed by a capacitor is about three to four nanoseconds.

The time delay of the pulse generated at the output terminal 9 with respect to the transition at terminal 3 will be, at worst (pulse 22):

$t' = t_1 + t_{33} + t_{35} + t_8$ $t'$ will be about 15 nanoseconds.

The duration of the pulse generated at the output terminal 9 will be:

$T' = t_2$ $T'$ will be about 4 nanoseconds.

The overall gain will be about ten nanoseconds as compared with the prior art.

Other advantages also appear:

In the circuit according to the invention, it is certain that the transition has been recorded for the system is arranged as a loop. It is quite certain that, at the moment when the rising edge of the pulse has been generated, it means that the values of the signals $S_{43}$ and $S_{46}$ are different and that there has been an address transition. Furthermore, the trailing edge of the pulse will be generated only when the new value of the signal $S_{43}$ has been memorized at terminal 46.

This circuit has only one stable state when the value of the input signal $S_{43}$ is equal to the value of the memorized signal $S_{46}$. The safety of this circuit is far greater than that of circuits used until now.

In the circuit used before, it was not really certain that the transition would be detected if the transfer times of the inverters were wrongly computed, since the comparison of the signals $S_3$, $S_4$, $S_5$ could give a pulse at terminal 7 so weak that it would be difficult to detect it.

This is why, by seeking a pulse with a satisfactory duration, its time delay was increased.

When the power is turned on, there is no problem if the value of the memorized signal $S_{46}$ is different from that of the input signal $S_{43}$ or generates a pulse, and the memorized signal $S_{46}$ changes its level. It is a return to the case where the two signals S43 and S46 have the same value and where the circuit is stable.

The flip-flop circuit 45 can also be used for other purposes, and the value of the memorized signal S46 or its reverse will be used. This will achieve the constantly pursued goal of gaining space in the integrated circuit.

What is claimed is:

1. A circuit for the detection of address transitions in an integrated circuit wherein an output pulse is generated as soon as there is an address change at an input terminal, said detection circuit comprising:
   an input terminal to which is applied an input logic signal,
   means connected to the input terminal for memorizing the state of the input logic signal and providing an output signal,
   comparison means having a first input terminal connected to the logic signal input terminal and a second input terminal connected to the output terminal of the memorizing means, said comparison means having an output terminal which is at a first logic signal level when its input terminals receive the same logic signal levels and at a second logic signal level when its input terminals receive different logic levels.

2. A circuit for the detection of address transitions according to claim 1 wherein said comparison means is an exclusive-OR gate having a first input terminal to which is applied said input logic signal and a second input terminal to which is applied said output signal of said memorizing means.

3. A circuit for the detection of address transitions according to claim 1 wherein said comparison means is an exclusive-NOR gate having a first input terminal to which is applied said input logic signal and a second input terminal to which is applied said output signal of said memorizing means.

4. A circuit for the detection of address transitions according to claim 1, wherein said memorizing means is a D flip-flop circuit having a first input terminal to which is applied said input logic signal and a second input terminal corresponding to a clock signal input terminal which is connected to the output terminal of said comparison means.

5. A circuit for the detection of address transitions according to claim 1, wherein said memorizing means is a D flip-flop having a first input terminal to which is applied said input logic signal and a second input terminal corresponding to the inverse clock signal input terminal which is connected to the output terminal of said comparison means.

6. A circuit for the detection of address transitions, wherein an output pulse is generated as soon as there is an address change at an input terminal, said detection circuit comprising:
   an input terminal to which is applied an input logic signal,
   means for memorizing the state of the input logic signal, said means having a first input connected to said input terminal, an enabling input for receiving an enabling signal, whereby the state of the input signal is stored in the memorizing means upon reception of the enabling signal, and an output for supplying a memorized logic signal,
   a comparison circuit for comparing the signal on the input terminal and the memorized logic signal, said comparison circuit providing an output signal depending upon whether the input signal and the memorized signal have the same logic level or not,
   said output signal of the comparison circuit being supplied as an enabling signal to the enabling input of the memorizing circuit.

7. A circuit according to claim 6, wherein said comparison circuit comprises an exclusive-OR gate having one input connected to said input terminal and another input connected to the output of the memorizing means.

8. A circuit according to claim 6, wherein said comparison circuit is an exclusive-NOR gate.

9. A circuit according to one of claims 6, 7, or 8, wherein said memorizing means is a flip-flop of the D flip-flop type, having a D input connected to the input terminal and a clock input connected to the output of the comparison circuit.

* * * * *